United States Patent [19]

Wang et al.

[11] Patent Number: 4,997,677

[45] Date of Patent: Mar. 5, 1991

[54] VAPOR PHASE REACTOR FOR MAKING MULTILAYER STRUCTURES

[75] Inventors: Christine A. Wang, Bedford; Robert A. Brown, Winchester; James W. Caunt, Concord, all of Mass.

[73] Assignee: Massachusetts Institute of Technology, Cambridge, Mass.

[21] Appl. No.: 91,268

[22] Filed: Aug. 31, 1987

[51] Int. Cl.[5] ............................................. C23C 16/00
[52] U.S. Cl. ................................ 427/248.1; 118/715; 118/724; 118/725; 118/730
[58] Field of Search ............... 118/715, 725, 730, 724; 427/248.1

[56] References Cited

U.S. PATENT DOCUMENTS

| | | | |
|---|---|---|---|
| 3,394,390 | 7/1968 | Cheney | 23/204 |
| 3,517,643 | 6/1970 | Goldstein | 118/715 |
| 3,578,495 | 5/1971 | Pammer | 118/725 |
| 3,603,284 | 9/1971 | Garnache | 118/725 |
| 3,916,822 | 11/1975 | Robinson | 118/725 |
| 3,996,025 | 12/1976 | Gulden | 48/107 |
| 4,033,286 | 7/1977 | Chern et al. | 118/49 |
| 4,051,382 | 9/1977 | Ogawa et al. | 250/531 |
| 4,066,037 | 1/1978 | Jacob | 118/49.1 |
| 4,212,663 | 7/1980 | Aslami | 65/144 |
| 4,223,048 | 9/1980 | Engle | 427/39 |
| 4,313,783 | 2/1982 | Davies et al. | 156/643 |
| 4,365,588 | 12/1982 | Jolly | 118/732 |
| 4,421,786 | 12/1983 | Mahajan et al. | 427/82 |
| 4,430,149 | 2/1984 | Berkman | 156/613 |
| 4,546,726 | 10/1985 | Nagasaka | 118/725 |
| 4,564,509 | 1/1986 | Shealy et al. | 423/210.5 |
| 4,625,678 | 12/1986 | Shioya et al. | 118/723 |
| 4,632,057 | 12/1986 | Price et al. | 118/719 |
| 4,649,859 | 3/1987 | Wanlass | 118/715 |
| 4,703,718 | 11/1987 | Enstrom | 118/725 |
| 4,732,110 | 3/1988 | Parsons | 118/719 |
| 4,745,088 | 5/1988 | Inoue et al. | 437/102 |
| 4,747,368 | 5/1988 | Brien et al. | 118/715 |
| 4,772,356 | 9/1988 | Schumaker et al. | 156/613 |
| 4,798,165 | 1/1989 | deBoer | 118/725 |

FOREIGN PATENT DOCUMENTS

| | | |
|---|---|---|
| 3530551 | 8/1985 | Fed. Rep. of Germany . |
| 3635647 | 10/1986 | Fed. Rep. of Germany . |
| 1518843 | 2/1986 | France . |
| 61-148249 | 6/1986 | Japan . |
| 61-248500 | 10/1986 | Japan . |
| WO87/07310 | 12/1987 | PCT Int'l Appl. . |
| 1189344 | 4/1970 | United Kingdom . |
| 2181460 | 4/1987 | United Kingdom . |

OTHER PUBLICATIONS

Wang et al., Abstract, 3d Int'l Conf. of Metalorganic Vapor Phase Epitaxy (13-17 Apr. 1986), Universal City, Calif.

Wang et al., Flow Visualization Studies for Optimization of OMVPE Reactor Design, 77 *J. Chrystal Growth* 135-143, Sep. 4, 1986.

Ikeda et al., Uniform Growth of GaAs by MOCVD on Multi-wafers, 77 *J. Crystal Growth* 157-162, Sep. 4, 1986.

Landgren et al., Novel Reactor Design for Large Area Uniformity of Abrupt Heterojunction Structures, 77 *J. Crystal Growth* 67-72,9/4/86.

(List continued on next page.)

*Primary Examiner*—Richard Bueker
*Attorney, Agent, or Firm*—Fish & Richardson

[57] ABSTRACT

A gaseous mixture is introduced through a radial inlet into a plenum-like antichamber above a porous diaphragm mounted across the top of a reactor vessel of substantially uniform width. The antichamber and diaphragm are substantially coextensive with the width of the vessel. The diaphragm may form part of a removable cover/diaphragm unit received in a collar-like ring. The substrate holder includes a molybdenum cap and base which fits over a pedestal of refractory material carrying a temperature sensor with an electrical lead extending down the hollow core of a rotatable reactor shaft. A combination hydrogen-purge/water cooling system surrounds the shaft.

33 Claims, 4 Drawing Sheets

OTHER PUBLICATIONS

Schumaker et al., *Journal of Metals*, "MOCVD Technology", Jun. 1986, pp. 41-44.

Dupuis, *Science*, "Metalorganic Chemical Vapor Deposition of III-V Semiconductors", Nov. 1985, pp. 623-629.

Ludowise, *J. Appl. Phys.*, 58(8), "Metalorganic Chemical Vapor Deposition of III-V Semiconductors", Oct. 15, 1985, pp. R31-R55.

Matsumoto et al., Flow Patterns in Various Vertical Reactors and MOVPE Growth, 77 *J. Crystal Growth* 151-156, Sep. 4, 1986.

Emcore GS/3000 System Description, Emcore (The Electronic Materials Company), P.O. Box 663, 111 Corporate Blvd., S. Plainfield N.J. 07080.

J. L. Vossen and W. Kern, eds., Thin Film Process, Academic Press, N.Y. (1978).

J. Bleom, G. Verspui and L. R. Wolff, eds., Proc. Fourth European Conf. CVD (1983).

J. M. Blocher, Jr., eds., Proc. of the Ninth Int. Conf. CVD, Electrochem. Soc. (1984).

Seki et al., *J. Electrochem. Soc.*, "*Properties of Epitaxial GaAs Layers from a Triethy Gallium and Arsine System*", *Aug. 1985, No. 8, pp. 1108-1112.*

Green, *Journal of Metals*, "Chemical Vapor Deposition of Metals for integrated Circuit Applications", Jun. 1985, pp. 63-71.

Bryant, *J. Material Science*, "Review the Fundamentals of Chemical Vapor Despositior", 12 (1977), pp. 1285-1306.

VAPOR PHASE REACTOR FOR MAKING MULTILAYER STRUCTURES

The Government has rights in this invention pursuant to Contract Number F19628-85-C-0002 awarded by the Department of the Air Force.

BACKGROUND OF THE INVENTION

The invention relates to the design and operation of gaseous reactor vessels for producing epilayers on a substrate.

Organometallic vapor phase epitaxy (OMVPE) is used to grow multilayer semiconductor structures for a variety of electronic and optoelectronic applications such as quantum well and super lattice devices. For many of these applications, the epilayers must be laterally uniform and the interfaces between successive epilayers, micro thin additive layers of different alloys, should be as abrupt as possible. To obtain abrupt interfaces with OMVPE, stepwise changes are made in the composition of the gas stream injected into the reactor. Consequently, epilayer quality is limited by gas dynamics. Optimization of the OMVPE process promises significant advantages over molecular beam epitaxy which, although presently offering more precise control, is by its nature slow, expensive, difficult to maintain and limited to a single wafer at-a-time. For certain applications practical mass production using OMVPE demands a higher degree of epilayer uniformity over a larger area with interface widths of at most a few monolayers.

While designed principally for OMVPE, several of the optimization techniques described below are applicable to other thin film technologies such as chemical vapor deposition.

SUMMARY OF THE INVENTION

A general feature of the invention lies in causing a gas mixture to flow uniformly downward from the top of a vertical reactor vessel toward a substrate mounted on a holder within the vessel. In general, this flow profile is achieved by injecting a gas mixture into a plenum-like antechamber of defined volume above a porous diaphragm across the top of the vessel. Preferred embodiments of the invention include an antechamber approximately coextensive with the width of the vessel having a volumetric relationship with the reactor vessel such that the ratio of their volumes is in a range of 1:50 to 1:10. The porous diaphragm is preferably a fine wire mesh or frit disk of inert material, and the inlet port to the antechamber is preferably radial with respect to a central axis of the reactor vessel.

In a preferred embodiment of the invention, an end cap assembly for the reactor vessel includes a collar-like ring mounted directly above the vessel. The diaphragm is connected, preferably resiliently suspended, to a cover to form a removable diaphragm/cover unit which is sealingly received within the ring. The inlet port is formed through the ring. Thus the ring, cover, and diaphragm define the volume of the antechamber.

The preferred embodiment of the invention also includes a substrate holder having a base and a removable cap of inductively heatable material such as molybdenum, and a pedestal of thermally insulating refractory material. A temperature sensor is carried by the base with an electrical lead extending through a hollow reactor drive shaft.

In an embodiment of the invention designed for use at reduced atmospheric pressure, with a heated substrate holder and heat sensitive seals, a cooling system is included within the vessel for lowering the temperature of the reactor shaft. The cooling system includes a water jacket surrounding the shaft. In addition the cooling system can provide a gas purge system under a purge enclosure to keep the shaft, seals and cooling components clean, surrounding the water cooling jacket which preferably supports a heat shield assembly within the enclosure. Thermally conductive gas is introduced into the bottom of the purge enclosure and exhausted at the top through an opening surrounding the reactor shaft. The purge gas, combined with the remaining gases from the reaction process, flow down the outside of the purge enclosure and out through the exhaust ports in the lower end cap.

DESCRIPTION OF THE PREFERRED EMBODIMENTS

The drawings are briefly described as follows.

STRUCTURE

The embodiment of the reactor system described herein is designed specifically for OMVPE for GaAs/AlGaAs heterostructures and is suitable for deposition of similar materials as well. The reactor design, geometry and operation are applicable not only to OMVPE reactors, but also to many other processes such as chemical vapor deposition.

Figure 1:
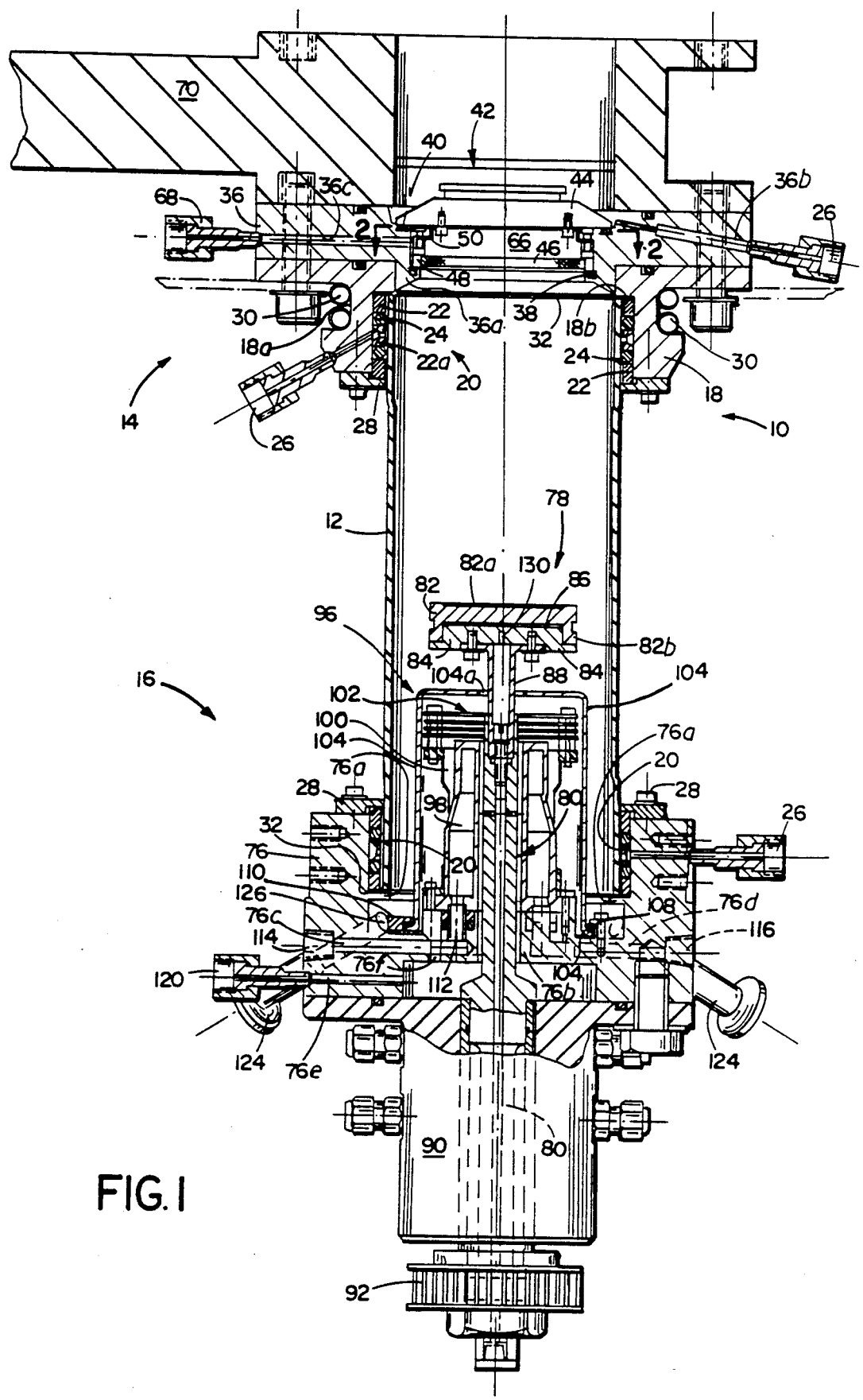
FIG. 1 is an assembly drawing of a reactor according to the invention in elevation with portions broken away to reveal longitudinal sections.

As shown in FIG. 1, a reactor vessel 10 is defined by an elongated cylindrical quartz reactor tube 12, an upper end cap assembly 14 and a lower end cap assembly 16. Assembly 14 includes a collar-like upper end cap weldment 18 which fits over the upper end of the tube 12. The inner circumference of the upper end cap weldment 18 is recessed to receive an evacuated dual O-ring compression seal 20. Seal 20 includes upper and lower compression rings 22 above and below O-rings 24 and pumping ring 22a between the O-rings 24. Pumping ring 22a is vented through a port in the weldment 18 to a vacuum line fitting 26 as shown in FIG. 1. Seal assembly 20 is secured by tube seal clamp ring 28 on the underside of the end cap weldment 18. Clamp ring 28 forces the compression rings 22 against the O-rings 24. A cooling tube coil 30 is cemented with thermally conductive epoxy to the spool-like groove 18a formed around the outside of weldment 18. A flat ring-shaped pad 32 is situated between the rim of the upper end of the reactor tube 12 and the inner annular shoulder 18b of the weldment 18.

Situated directly above and coaxially with the end cap weldment 18 is another weldment forming a mixing ring 36. Mixing ring 36 has a beveled lip 36a which fits inside the upper flange of the end cap weldment 18. A lower square ring seal 38 is carried in a groove on a lower annular inwardly protruding shoulder formed in the lip 36a of the mixing ring as shown. An upper O-ring seal 40 is carried in a groove formed in the rim around the inner circumference of the mixing ring.

Figure 2:
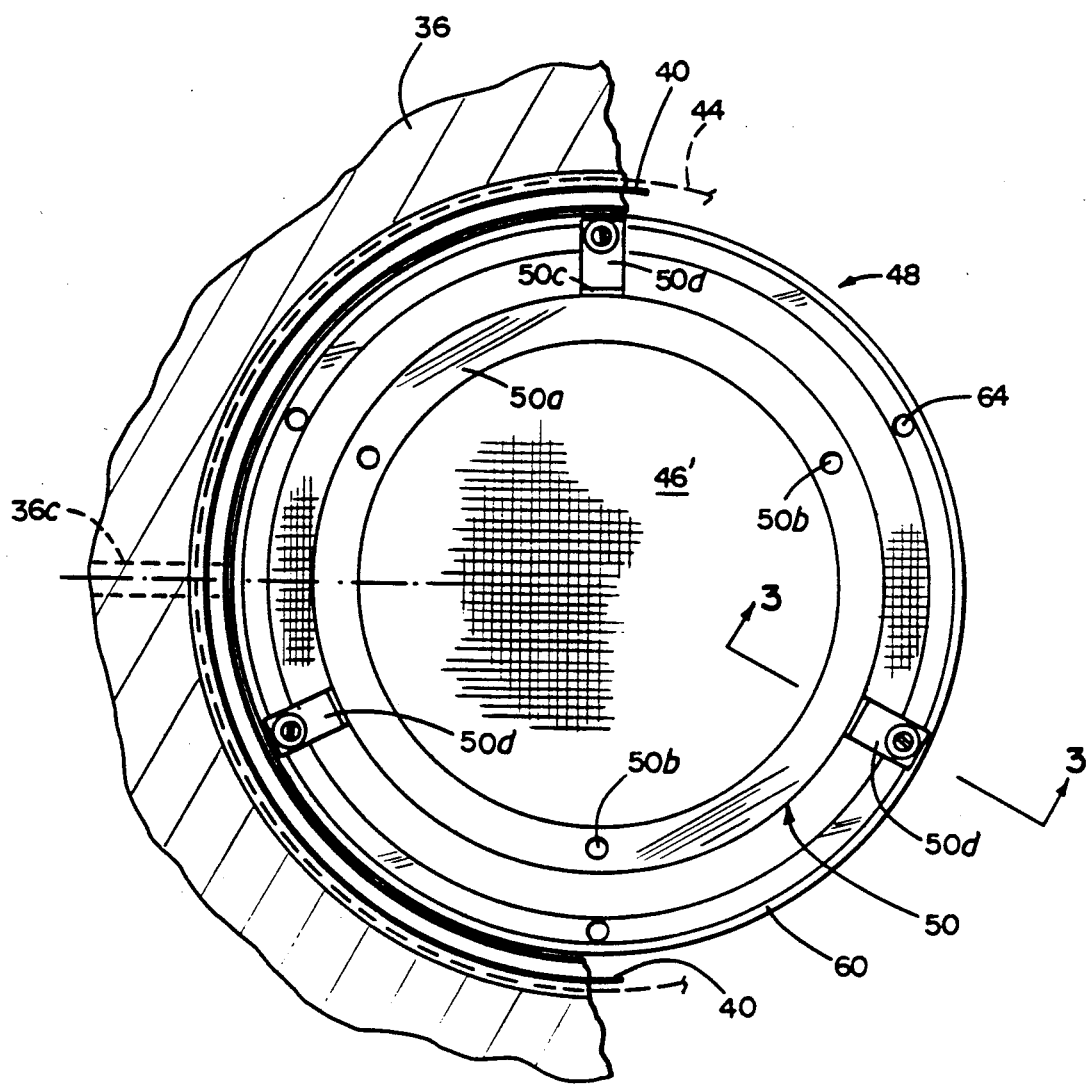
FIG. 2 is a detail plan view of the diffuser assembly taken along lines 2—2 of FIG. 1 with an alternate embodiment of the porous diaphragm.

A removable spring-loaded diffuser/cover assembly 42 is received within the mixing ring 36 as shown in FIGS. 1 and 2. The diffuser/cover assembly 42 comprises a solid discus-shaped stainless steel cover block 44, a porous diaphragm 46 of inert material framed in a stainless steel diaphragm ring 48 connected to cover block 44 by a spring-loaded, three-legged spacing bracket 50. The periphery of the flat lower surface of cover block 44 presses sealingly against upper O-ring 40 while seating against the adjacent rim of mixing ring 36. The lower edge of the diaphragm ring 48 is urged sealingly against the square ring seal 38. Seals 38 and 40 (and O-rings 24) are made of a high temperature resilient material such as VITON. The annular space around the cover block 44 is vented through bore 36b in the mixing ring 36 to a vacuum line fitting 26.

Figure 3:
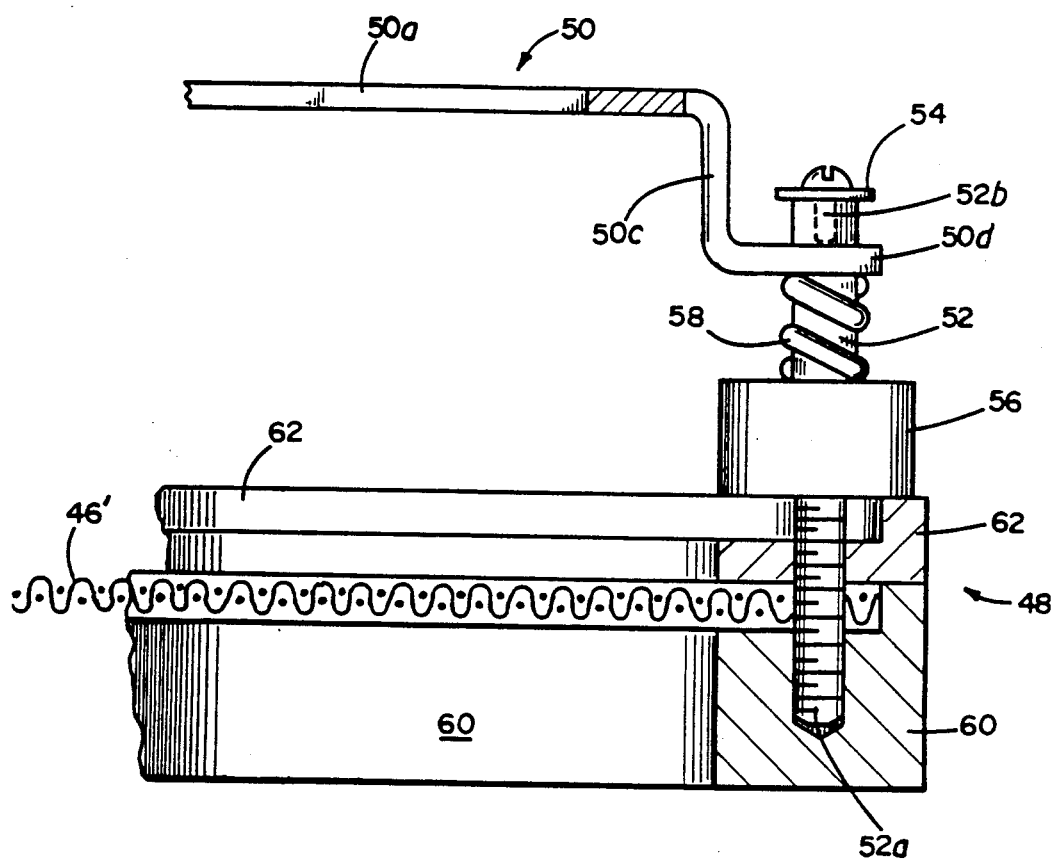
FIG. 3 is a detail partial sectional view taken along lines 3—3 of FIG. 2 illustrating the construction of the diffuser assembly and mounting bracket.

Two different embodiments of the porous diaphragm 46 are shown in the drawings. In FIG. 1, the diaphragm 46 is a sintered quartz frit disk. In the embodiments of FIGS. 2 and 3, the quartz frit is replaced by a fine stainless steel wire mesh 46'. The bracket 50 connecting the diaphragm ring 48 to the cover block 44 is identical in the two embodiments. As shown in more detail in FIGS. 2 and 3, the bracket 50 includes a flat ring 50a with three mounting holes 50b for fastening the bracket 50 to the flat underside of the cover block 44, as shown in FIG. 1, and three equally spaced legs 50c connecting the bracket 50 to the diaphragm ring 48. As shown in FIGS. 1 and 3, each leg 50c has a radial foot or tab 50d with a hole through which a threaded stud 52 is received. The lower threaded ends 52a of the studs are received in three respective threaded bores in the diaphragm ring 48. The upper end of each stud 52 has a threaded counter-bore 52b which receives a small machine screw clamping a washer 54 to the top of the stud 52. Nut 56 is received on the threaded end 52a of the stud 52 and rests against the rim of the diaphragm ring 48 as shown. Tab 50d is trapped slidingly between the nut 56 and washer 54. A respective compression spring 58 between each nut 56 and tab 50a tends to urge each tab 50a against the washer 54.

In the wire mesh embodiment, the screen 46' is clamped between lower and upper rings 60 and 62, together forming the diaphragm ring 48, as shown in FIG. 3. Three additional bores 64 (FIG. 2) are formed through the upper and lower retaining rings to aid in assembling the screen 46 and diaphragm ring 48 before attachment of the bracket 50.

A disc-shaped volume called the "antechamber" 66 is defined between the cover block 44, porous diaphragm 46 and the inner circumference of the mixing ring 36. A radial bore 36c through the mixing ring 36 as shown in FIGS. 1 and 2, forms the inlet to the antechamber 66. Bore 36c is connected to receive the gaseous mixture via fitting 68 (FIG. 1).

The upper end cap assembly 14 is completed by a hinged gate valve assembly 70 of conventional design from (e.g., from Torr Vac Corporation of Simi Valley Calif.). Gate valve assembly 72 includes bolts which clamp the weldments 18 and 36 together. The upper surfaces of the weldments carry additional O-ring seals as shown.

The lower end cap assembly 16 includes a lower end cap weldment 76 having a cylindrical recess which receives the lower end of the reactor tube 12. The sealing system for the lower end of the tube 12 is similar to that for the upper end. Thus, a pumped dual O-ring compression seal 20 is employed, and the rim of the tube 12 seats against a ring pad 32 resting on inner annular flange 76a.

A rotatable disk-shaped susceptor assembly 78 is coaxially mounted a variable distance below the diaphragm 46 on a reactor shaft 80 which extends through a central opening in the floor 76b of the lower end cap weldment 76. The susceptor assembly 78 includes a removable cap 82 of solid molybdenum having a generally circular recess 82 in its upper face for a wafer (not shown) of semiconductor material such as silicon or gallium arsenide. The cap 82 fits over the susceptor base 84 of solid molybdenum. Preferably, the cap 82 is supported by a rim 82b engaging a mating shoulder of the base 84 so that there is a thin disk-shaped gap 86 between the cap 82 and base 84 to reduce the heat conduction down the rotation shaft, thus increasing the lateral temperature uniformity of the susceptor. The base 84 is supported on a hollow pedestal-like ceramic mounting shaft 88 as shown, made of $Al_2O_3$. The lower end of the mounting shaft 88 is secured to the reactor shaft 80 by means of a hollow fastening bolt which is received in a threaded bore in the upper end of the reactor shaft 80 as shown in FIG. 1.

The lower end of the reactor shaft passes through the opening in the floor of the reactor to a magnetic seal module 90 which is bolted and sealed to the underside of the end cap weldment 76 as shown. The magnetic seal is commercially available from Ferro-Fluidics Corp., Nashua, N.H., and its details do not form a portion of the subject matter of the present invention. The end of the reactor shaft 80 is connected to a pulley 92 connected to a motor driven timing belt (not shown). Pulley 92, reactor shaft 80 and susceptor assembly 78 rotate together. They are the only moving parts of the reactor vessel 10.

The floor 76b, through which the reactor shaft 80 extends, supports a cooling structure 96 inside the reactor vessel 10 surrounding the reactor shaft 80 and pedestal 88 of the susceptor assembly 78. The purpose of the cooling structure is to lower the temperature of the reactor shaft 80 to the operating temperature range of the magnetic seal 90. Cooling structure 96 incorporates two cooling media: water and hydrogen. An elongated annular water-cooling jacket 98 is bolted to an annular boss on the center of the floor 76b as shown. Attached to the upper outer surface of the water jacket 98 is a bracket 100 for supporting a heat shield structure 102 comprised of several spaced, thin, circular, metallic disks. The heat shield assembly 102 has an opening with clearance for the reactor shaft 80 to pass through the center. The water jacket 98 and heat shield assembly 102 are housed within a purge cannister 104 having a lower open end with an annular flange situated between a lower tube pad 106, of the same material as the reactor pad 32, and a resilient ring 108. Ring 108 is engaged by a clamping ring 110 bolted to the floor 76b.

Radial bore 76c in weldment 76 is connected to the water inlet as shown. Bore 76c is communicated to the interior of the water cooling jacket 98 via tube 112 received in an axial bore in the floor 76b sealed by an O-ring, engaged by a compression ring, forced by the bottom of the cooling jacket as shown in FIG. 1.

A radial water outlet bore 76d on the other side of the weldment 76 is communicated with the interior of the water cooling jacket 98 in a similar manner so that water can flow in through the inlet 114, through water jacket 98 and out the outlet 116 as shown in FIG. 1.

Hydrogen as a coolant and purge gas enters the lower end cap weldment via fitting 120, passes through bore 76e into the space below the floor 76d and up through a plurality of holes 76f through the floor 76b into the space between the cooling jacket 98 and the purge cannister 104. Hydrogen also rises up through the cylindrical space defined between the reactor shaft 80 on the one hand and the floor 76b, cooling jacket 98 and heat shields 102, on the other hand. Heat from the susceptor assembly 78 which is conducted down the rotation shaft 80, is removed by being conducted through the hydrogen layer within the cylindrical space between the rotation shaft 80 and the inside surface of the cooling jacket 98. Whether entering inside or outside the cooling jacket 98, hydrogen exits the cooling structure 96 through the central opening 104a in the purge cannister surrounding the mounting pedestal 88.

The reactor vessel 10 is evacuated and exhausted by means of a vacuum pump connected to vacuum fittings 124 which extend through angled bores in the lower end cap weldment 76 to vacuum ports 126 below the lower end of the tube 12.

As shown in FIG. 1, a thermocouple can be mounted in a central recess 130 in the underside of the molybdenum base 84. The leads from the thermocouple can be run through the hollow interior of the pedestal 88 and reactor shaft 80 to a slip ring assembly (not shown) below the pulley 92 forming the necessary rotary electrical junction.

Operation

With the apparatus of FIG. 1, the diffuser/cover assembly 42 can be easily removed to provide access to the susceptor assembly 78. To load, a wafer is placed onto the cap 82. Alternatively, the cap 82 is removed, loaded with a wafer and then replaced. After loading, the diffuser/cover assembly 42 is put back in place and the vessel 10 is evacuated and the susceptor heated.

Figure 4:
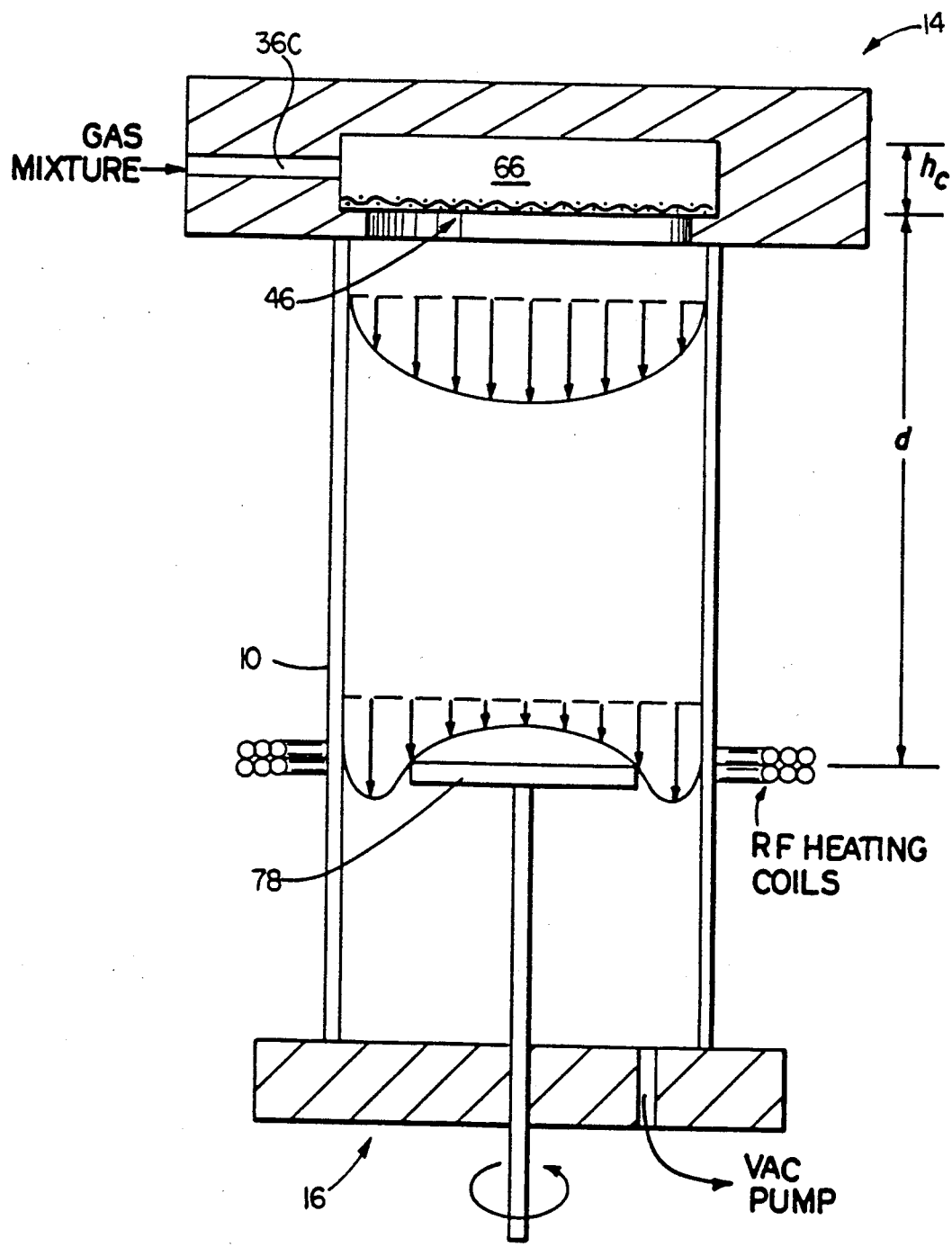
FIG. 4 is a schematic representation illustrating the operation of the reactor vessel according to the invention.

As shown in FIG. 4, a gaseous organometallic mixture is introduced into the antechamber 66 via the radial injection port 36. A typical rate through the injection port is approximately 10 liters per minute of hydrogen ($H_2$), 2 cubic cm per minute of trimethyl-gallium and 100 cubic cm per minute of arsine. The mesh size or porosity of the diaphragm 46 is such that the gaseous mixture completely fills the plenum-like antechamber 66 before passing through the porous floor of the antechamber. A typical mesh size for the wire mesh version of the diaphragm is 100 microns. Mesh sizes of 30 to 400 microns are believed to be suitable for use with a 10 cm reactor with a approximately 7.5 cm in diameter. As shown in FIG. 4, the gas mixture exhibits vertical laminar flow downward through the porous diaphragm 46. The use of a radial inlet followed by a porous diaphragm across most of the inner diameter of the reactor tube results in uniform injection over a large cross section encompassing the diameter of the susceptor.

The antechamber 66 should be small in relation to the effective volume of the reactor vessel 10, defined as the volume encompassed by the vessel 10 between the susceptor 78 and diaphragm 46. The preferred volumetric ratio of antechamber to reactor vessel is about 1:20. It is believed, however, that useful uniform velocities may be achieved over a volumetric range of 1:50 to 1:10. If the antechamber 66 and vessel 10 have about the same cross-sectional area, the ratio of the heights $h_c$ and d, as shown in FIG. 4, will give the volumetric ratio.

The susceptor assembly 78 holding the GaAs wafer is heated by RF heating coils (FIG. 4). As shown in FIG. 1, the molybdenum cap 82 is the element which actually becomes inductively heated. A typical temperature range for the susceptor cap is 600° to 800° C.

Nearly ideal stagnation flow of the gas mixture occurs at the boundary with the susceptor assembly 78 as shown in FIG. 4. Rotating the susceptor assembly 78 causes a pumping action which aids in establishing a self-similar velocity profile along the substrate which produces a more uniform boundary layer. Flow patterns within the reactor are affected by gas injection rate and mass flow rates, disk rotation, heating and reactor pressure.

At room temperature and one atmosphere pressure within the reactor, the time lapsed before the laminar flow from the diaphragm reached the disk 15 cm below was approximately 4 to 5 seconds. Reducing the reactor pressure to 0.1 atmosphere (atm) without changing the mass flow rate increased the gas velocity by a factor of 10, thus reducing the transit times.

Flow visualization studies of the effectiveness of the present reactor design are presented in Wang et al. "Flow Visualization Studies for Optimization of OMVPE Reactor Design", *Journal of Crystal Growth*, Vol. 77, pages 136–143 (Sept. 4, 1986), incorporated by reference herein.

Optimizing the experimental conditions for an OMVPE reactor to achieve epilayer uniformity and permit abrupt changes in composition requires control of the gas flow adjacent to the substrate as well as throughout the reactor tube. For epilayer uniformity, the boundary layer at the substrate must be of uniform thickness. For a vertical flow, rotating disk reactor, two mechanisms are available for forming such a uniform layer. One utilizes the stagnation flow that occurs when a fluid impinges normally on a flat surface. If the velocity of the impinging fluid is uniform across the surface, this flow produces a uniform boundary layer in which fluid moves radially outward. The uniform velocity obtained by injection through a porous diaphragm meets this requirement for nearly ideal stagnation flow. The thickness $\delta$ of the boundary layer produced by stagnation flow is proportional to the ratio $(n/\rho V)^{\frac{1}{2}}$ where n and $\rho$ are the fluid viscosity and density, respectively, and V is the velocity of the impinging gas. Assuming that the gas is ideal, $\rho$ is proportional to the reactor pressure P. Since n is independent of P, for a constant mass flow rate (proportional to the volumetric flow rate at 1), $\delta$ is independent of P. Thus, injection through a porous diaphragm should be as effective in producing a uniform boundary layer at reduced pressures as at atmospheric pressure.

Rotating the disk provides a second mechanism for obtaining a boundary layer of uniform thickness. As the pressure inside the reactor is reduced below 1 atmosphere, the annular velocity of the disk must be increased in order to obtain the same boundary layer thickness. Angular rates of zero to 1800 rpm may be employed.

Heating the susceptor disk is necessary to pyrolize the arsine and trimethylgallium in order to crack these materials so that they will deposit on the GaAs water. However, heating the disk can also result in a flow dominated by thermal convection. Such a flow is not uniform and the gas residence time is increased. Buoyancy-driven convection exhibits pressure dependence. Thermal convection decreases markedly with decreasing pressure.

Susceptor disk temperatures of about 600° C. produce thermal convection when the distance between the eliminated by disk rotation rates even up to 1800 rpm. However, reducing the pressure below 0.3 atm (without rotation) can eliminate these effects, and achieve laminar flows like those observed without heating. Reducing the distance (d, FIG. 4) between the diaphragm and disk will result in a higher pressure, to eliminate the thermal convection for the same mass flow rate.

Low pressure operation of a vertical OMVPE growth reactor with gas injection through a radial inlet to a porous diaphragm appears to be the preferred approach for growing uniform epilayers with abrupt compositional changes. Disk rotation can be utilized to influence gas flow and thereby improve uniformity.

Studies show that for GaAs/AlGaAs, hetero-structures grown under these conditions, interface widths of two to three monolayers are obtained at growth rates of 10 Angstroms per second with gas flow rates of 10 liters per minute at a susceptor distance (d) of 16 cm. Still narrower interfaces are expected to be obtained by decreasing the growth rate, increasing the flow rate or decreasing the inlet susceptor distance. Epilayer uniformities of ±1% in thickness over a 2 inch wafer have been achieved using the foregoing techniques.

The description of the foregoing embodiments and operating parameters has been undertaken for purposes of illustration. The basic principles of the invention can be embodied in other designs or the same design with modifications operating under the same or different conditions without departing from the scope of the invention.

For example, the system is operable with a variety of designs for the antechamber 66. One of the advantages of the preferred embodiment, however, is that the one piece diffuser/cover assembly can be easily removed for access to the removable susceptor cap 82. The removability of the susceptor cap also facilitates cleaning. In designs which do not require susceptor disk rotation, for example, the cooling structure can be dispensed with where it is present only because of the magnetic seal.

What is claimed is:

1. A reactor for growing epilayers on a substrate, comprising
    an elongated vessel of substantially uniform width and an opening at one end,
    a substrate holder mounted within the vessel,
    a porous diaphragm mounted across said opening,
    a plenum-like antechamber of predetermined volume defined adjacent said diaphragm, said diaphragm forming the interface between the antechamber and the interior of the vessel, said antechamber having a wall substantially perpendicular to an end face or said vessel, and
    an inlet port defined in said wall in said antechamber for admitting a gas mixture into said antechamber, said inlet port adapted to admit said gas in a direction substantially perpendicular to said wall and against a portion of said wall opposite aid inlet port for causing turbulence and for uniform laminar flow through said diaphragm toward said substrate holder.

2. The reactor of claim 1, wherein said antechamber is approximately coextensive with the end face of said vessel.

3. The reactor of claim 1, wherein the ratio of the volumes of said antechamber and said vessel are in a range of 1:50 to 1:10.

4. The reactor of claim 1, wherein said porous diaphragm is a wire mesh.

5. The reactor of claim 1, wherein said porous diaphragm is a frit disk.

6. The reactor of claim 1, wherein said vessel has a central axis and said inlet port is approximately radial with respect to the central axis of said vessel.

7. The reactor of claim 1, wherein said porous diaphragm has substantially uniform porosity.

8. The reactor of claim 1, further comprising an end cap assembly including a collarlike ring mounted adjacent said vessel, a cover, said diaphragm being connected to said cover to form a removable diaphragm/cover unit,
    said diaphragm/cover unit being sealingly and removably received within said ring, said diaphragm, cover and ring defining the volume of said antechamber, said inlet port being defined through said ring.

9. The reactor of claim 8, wherein said vessel has a central axis and said port is defined through said ring approximately radially with respect to the central axis of said vessel.

10. The reactor of claim 8 wherein said diaphragm is resiliently suspended from said cover.

11. The reactor of claim 10 wherein said diaphragm/cover unit further includes a mounting bracket for resiliently suspending and spacing said diaphragm from said cover.

12. The reactor of claim 11, wherein said cover has a greater width than said diaphragm, said ring having a rim engaged by the outer periphery of the underside of said cover and a lower ledge engaged by the periphery of said diaphragm.

13. The reactor of claim 12, wherein said rim and lower ledge are equipped with resilient seals.

14. The reactor of claim 1, wherein said substrate holder includes a base and a cap of material susceptible to RF induction having a surface for mounting said substrate, received over said base.

15. The reactor of claim 14, wherein said substrate holder further includes a hollow insulating pedestal, said base being mounted to said pedestal.

16. The reactor of claim 15, wherein said mounting pedestal is mounted for rotation in said vessel,
    a temperature sensor located in said base, said temperature sensor having an electrical lead extending through the hollow interior of said pedestal.

17. The reactor of claim 1, wherein said vessel further includes a second end cap, a rotatable reactor shaft coupled to said substrate holder extending through an opening in said second end cap, and
    means connected to said second end cap for cooling said shaft.

18. The reactor of claim 17, wherein said cooling means includes a water cooling jacket surrounding said shaft supported by said end cap.

19. A reactor for growing epilayers on a substrate, comprising
    an elongated vessel of substantially uniform width and an opening at one end,
    a second end cap, a porous diaphragm mounted across said opening,
a substrate holder mounted within the vessel, said substrate holder coupled to a rotatable reactor shaft extending through an opening in said second end cap,
a plenum-like antechamber of predetermined volume defined adjacent said diaphragm, said diaphragm forming the interface between the antechamber and the interior of the vessel,
an inlet port in said antechamber for admitting a gas mixture into said antechamber for uniform laminar flow through said diaphragm toward said substrate holder, and
cooling means connected to said second end cap for cooling said shaft, said cooling means including:
a water cooling jacket surrounding said shaft and supported by said second end cap, and
a gas purge system including a purge enclosure surrounding said water cooling jacket and means for introducing a thermally conductive gas into the bottom of said purge enclosure.

20. The reactor of claim 19, wherein said cooling structure further includes a heat shield assembly supported by said water cooling jacket inside said purge enclosure.

21. The reactor of claim 20, wherein said purge enclosure has an opening at the end opposite to where said conductive gas is introduced, surrounding said shaft, for exhausting the purge gas to the interior of the reactor vessel.

22. A method for growing a layer on a substrate in a reactor, said reactor including:
an elongated vessel of substantially uniform width sand an opening at one end,
a substrate holder mounted within the vessel,
a porous diaphragm mounted across said opening,
a plenum-like antechamber of predetermined volume defined adjacent said diaphragm, said diaphragm forming the interface between the antechamber and the interior of the vessel, said antechamber having a wall substantially perpendicular to the end face of said vessel, and
an inlet port defined in said wall in said antechamber for admitting a gas mixture into said antechamber, said inlet port adapted to admit said gas in a direction substantially perpendicular said wall and against a portion of said wall opposite said inlet port for causing turbulence and for uniform laminar flow through said diaphragm toward said substrate holder,
said method comprising the steps of:
mounting said substrate on said substrate holder,
introducing a gas precursor of said layer through said inlet port into said antechamber at such a rate that said gas precursor impinges on a portion of said wall opposite said inlet port to cause turbulent mixing,
the pressure of said vessel and the rate of flow of said gas precursor through said vessel being maintained to sustain laminar flow.

23. The method of claim 22 further comprising the step of evacuating said elongated vessel following the step of mounting and preceding the step of introducing said gas precursor.

24. The method of claim 23 further comprising the step of heating said substrate following the step of evacuating said elongate vessel and preceding the step of introducing said gas precursor.

25. The method of claim 22 further comprising the step of rotating said substrate following the step of mounting and preceding the step of introducing said gas precursor.

26. The method of claim 22 wherein said gas precursor comprises a mixture of gases.

27. The method of claim 22 further comprising, following the step of introducing said gas precursor of said layer, the step of introducing a second gas precursor of a second layer through said inlet port into said antechamber at such a rate that said second gas precursor impinges on a portion of said wall opposite said inlet port to cause turbulent mixing,
the pressure of said vessel and the rate of flow of said second gas precursor through said vessel being maintained to sustain laminar flow, whereby said second gas precursor forms a second layer on said layer.

28. The reactor of claim 14 wherein the surface of said cap is parallel to the said porous diaphragm.

29. A reactor for growing epilayers on a substrate, comprising
an elongated vessel of substantially uniform width having an opening at one end and a central longitudinal axis,
a substrate holder mounted within the vessel,
a porous diaphragm mounted across said opening,
a plenum-like antechamber of predetermined volume defined adjacent said diaphragm, said diaphragm forming the interface between the antechamber and the interior of the vessel, and
an inlet port defined in a wall of said antechamber, said inlet port having a flow axis extending through said wall transverse to said central longitudinal axis for admitting a gas mixture into said antechamber for uniform laminar flow through said diaphragm toward said substrate.

30. The reactor of claim 29 wherein said inlet port adapted to admit said gas in a direction substantially perpendicular to said longitudinal axis.

31. The reactor of claim 29 wherein said substrate holder has means for supporting said substrate substantially perpendicularly to said longitudinal axis.

32. The reactor of claim 30 wherein said substrate holder has means for supporting said substrate substantially perpendicularly to said longitudinal axis.

33. A method for growing a layer on a substrate in a reactor, said reactor comprising
an elongated vessel of substantially uniform width having an opening at one end a central longitudinal axis,
a substrate holder mounted within the vessel,
a porous diaphragm mounted across said opening,
a plenum-like antechamber of predetermined volume defined adjacent said diaphragm, said diaphragm forming the interface between the antechamber and the interior of the vessel, and
an inlet port defined in a wall of said antechamber, said inlet port having a flow axis extending through said wall transverse to said central longitudinal axis for admitting a gas mixture into said antechamber for uniform laminar flow through said diaphragm toward said substrate,
said method comprising the steps of:
mounting said substrate on said substrate holder,
introducing a gas precursor of said layer through said inlet port into said antechamber toward said central longitudinal axis, and
maintaining the pressure of said vessel and the rate of flow of said gas precursor through said vessel to sustain laminar flow.

* * * * *

UNITED STATES PATENT AND TRADEMARK OFFICE
CERTIFICATE OF CORRECTION

PATENT NO. : 4,997,677

DATED : March 5, 1991

INVENTOR(S) : Wang et al.

It is certified that error appears in the above-identified patent and that said Letters Patent is hereby corrected as shown below:

On the Title page,
In the References Cited, Foreign Patent Documents, "1518843 2/1986 France" should be --1518843 2/1968 France--.

Page 2 of Other Publications, in the Seki et al. reference, "Triethy" should be --Triethyl--.

Col. 6, line 45, "&" should be --$\delta$--;
        line 59, "annular" should be --angular--.

Col. 7, after line 5, but before line 6, insert --diaphragm and disk is 15 cm, which can fail to be--.

Signed and Sealed this

Twenty-fifth Day of May, 1993

Attest:

MICHAEL K. KIRK

*Attesting Officer*　　　　*Acting Commissioner of Patents and Trademarks*